United States Patent [19]

Davé et al.

[11] Patent Number: 5,429,732
[45] Date of Patent: Jul. 4, 1995

[54] HIGH RATE ION BEAM SPUTTERING PROCESS

[75] Inventors: Sandeep Davé, Bethel; Ronald A. Wilklow, Ridgefield, both of Conn.

[73] Assignee: Hughes Aircraft Company, Los Angeles, Calif.

[21] Appl. No.: 197,643

[22] Filed: Feb. 14, 1994

[51] Int. Cl.$^6$ ............................................. C23C 14/34
[52] U.S. Cl. ......................... 204/192.11; 204/298.04
[58] Field of Search ..................... 204/192.11, 298.02, 204/298.04

[56] References Cited

U.S. PATENT DOCUMENTS

| | | | |
|---|---|---|---|
| 4,793,908 | 12/1988 | Scott et al. | 204/298.04 X |
| 4,885,070 | 12/1989 | Campbell et al. | 204/298.04 X |
| 5,017,277 | 5/1991 | Yoshida et al. | 204/298.02 |
| 5,037,521 | 8/1991 | Nishikawa et al. | 204/298.02 |
| 5,064,520 | 11/1991 | Miyake et al. | 204/298.04 X |
| 5,082,545 | 1/1992 | Tanaka et al. | 204/298.02 X |
| 5,207,884 | 5/1993 | Char et al. | 204/298.02 |

OTHER PUBLICATIONS

"Acoustical Engineering", H. Olson, D. Van Nostrand Co., 1967, pp. 692–703.

*Primary Examiner*—Nam Nguyen
*Attorney, Agent, or Firm*—W. C. Schubert; W. K. Denson-Low

[57] ABSTRACT

An ion beam sputtering process for fabricating a multilayer optical coating. The process adds energy to surface atoms of a sputtering target to increase deposition rates of atoms comprising the optical coating, thereby improving yield. The present process comprises providing a sputtering chamber. A sputtering target having a predetermined binding energy is disposed in the sputtering chamber, along with an optical element onto which a multilayer optical coating is to be deposited. The sputtering chamber is then pressurized to a predetermined sputtering pressure. Energy is then applied to the sputtering target to increase the vibrational energy of surface atoms and mean target energy thereof, thereby decreasing the amount of energy required to sputter atoms from the surface of the sputtering target onto the surface of the optical element. Energy may be added to the surface atoms of the sputtering target by adding acoustic (ultrasonic) energy, by irradiating the surface of the target using a laser, or by causing lattice strain in the target.

3 Claims, 2 Drawing Sheets

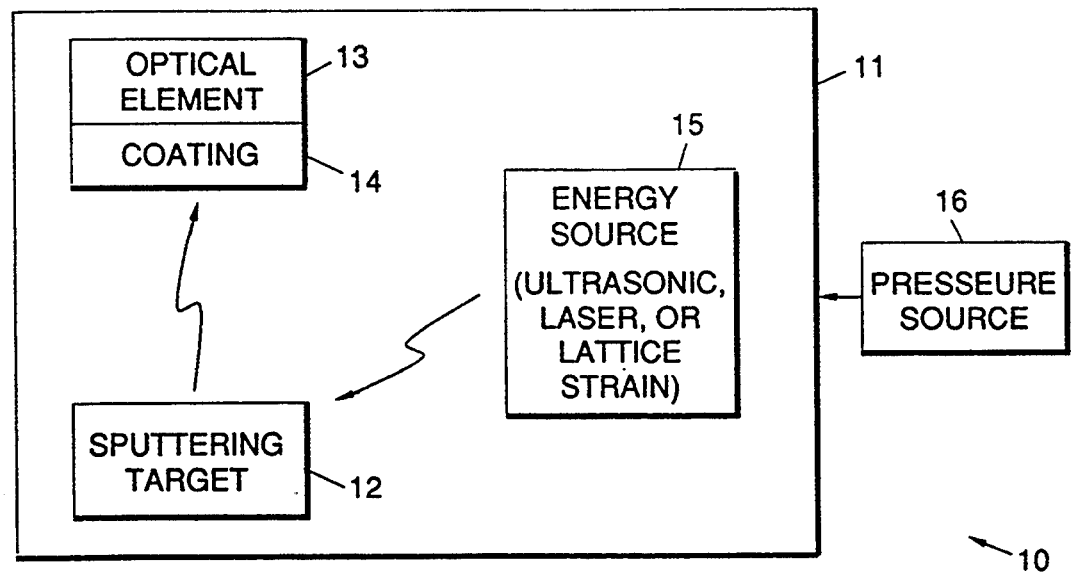
Fig. 1
Fig. 2
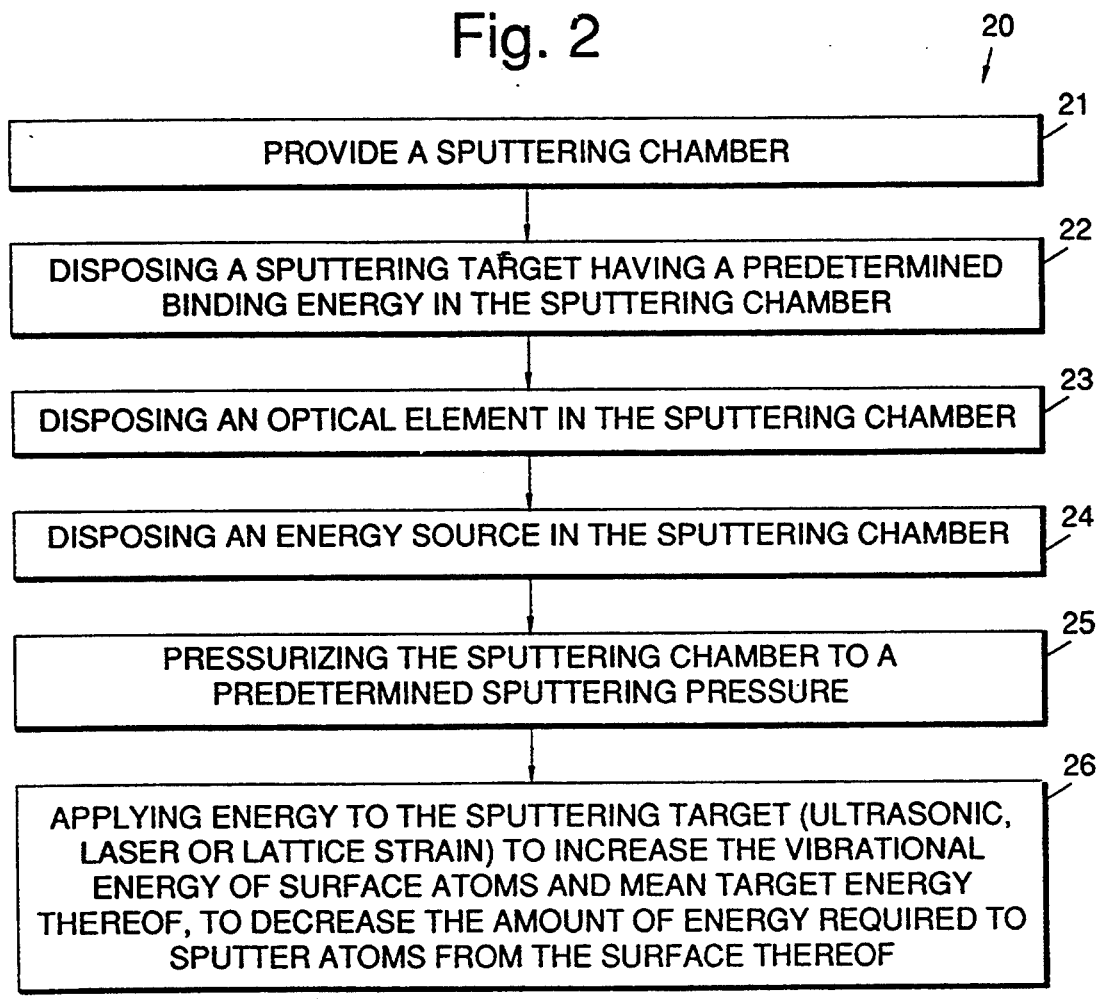

HIGH RATE ION BEAM SPUTTERING PROCESS

BACKGROUND

The present invention relates to sputtering processes, and more particularly, to an improved ion beam sputtering process for producing multilayer optical coatings, and the like.

One conventional sputtering process is known as magnetron sputtering. The operating pressure of the magnetron sputtering process is relatively high, which provides for a relatively low mean free path. While the magnetron sputtering process can be conducted at relatively high rates, higher pressures used in this process result in poor film structure. A better understanding the this conventional magnetron sputtering process may be had from a reading of a book by "J. Vossen and W. Kern entitled "Thin Film Processes", Academic Press (1978)", for example.

The assignee of the present invention has employed a conventional ion beam sputtering process to produce optical coatings, and the like. This conventional ion beam sputtering process produces superior quality optical coatings that have low absorption, high packing density, good step coverage, and may comprise novel coating materials. However, this conventional ion beam sputtering process a relatively slow process. Using this conventional ion beam sputtering process, deposition rates are on the order of 1 Å/second, which results in deposition times of around 40 hours for a typical dielectric reflector coating, for example. Consequently, in order to complete a multilayer coating within a reasonable length of time, sputtering yield must be increased to achieve a deposition rate of approximately 5 Å/second. This would allow the fabrication of multilayer coatings in approximately 8 hours, thereby making the ion beam sputtering process a commercially viable process. The present invention has been developed to produce these desired improvements.

Therefore, it is an objective of the present invention to provide for an improved ion beam sputtering process for producing multilayer optical coatings, and the like. It is a further objective of the present invention to provide for an ion beam sputtering process that adds energy to surface atoms of a sputtering target to increase deposition rates and improve the sputtering yield of the process.

SUMMARY OF THE INVENTION

In order to meet the above and other objectives, the present invention is an ion beam sputtering process for fabricating multilayer optical coatings, and the like, that adds energy to surface atoms of a sputtering target to increase deposition rates of atoms comprising the optical coatings, thereby improving the yield of the process.

More particularly, the present process is an ion beam sputtering process for fabricating multilayer optical coatings that comprise the following steps. The first step is to provide a sputtering chamber. Then, a sputtering target having a predetermined binding energy is disposed in the sputtering chamber. Then, an optical element onto which a multilayer optical coating is to be deposited is disposed into the sputtering chamber. The sputtering chamber is then pressurized to a predetermined sputtering pressure. Energy is then applied to the sputtering target to increase the vibrational energy of surface atoms and mean target energy thereof, thereby decreasing the amount of energy required to sputter atoms from the surface of the sputtering target onto the surface of the optical element. Energy may be added to the surface atoms of the sputtering target by adding acoustic (ultrasonic) energy, by irradiating the surface of the target using a laser, or by causing lattice strain in the target.

In the present ion beam sputtering process the rate increase is achieved by increasing the mean energy of the target material which decreases its binding energy ($E_b$). The mean energy of the target material may be increased by applying acoustic power such as in the form of ultrasonic energy, which can exceed 700 Watts, for example, to increase the vibrational energy of the surface atoms of the target material, thereby decreasing the energy required to sputter atoms from the surface of the target material. While it is known that increasing etch rates and erosion rates by applying ultrasonic energy to a material is well documented, this concept has not been applied to sputtering processes. For reference, the book "Acoustical Engineering", by H. Olson, D. Van Nostrand Co., 1967, describes procedures for increasing etch rates and erosion rates by applying ultrasonic energy to material.

The present ion beam sputtering process has been developed to produce superior quality optical coatings that provide for low absorption, high packing density, good step coverage, and may use new coating materials, and is a relatively fast process. In contrast, the deposition rates of the above-described conventional ion beam sputtering process are about 1 Å/second resulting in deposition times of approximately 40 hours for a dielectric reflector coating, for example. The present invention increases the mean energy of the target atoms, thus reducing the energy required for target atoms to sputter. The present invention increases the sputtering yield to a rate of approximately 5 Å/second which permits fabrication of a multilayer coating within a reasonable length of time, typically on the order of 8 hours, for example.

The present process is adapted to produce superior quality optical films for use in optical applications. These optical applications include laser safety filters that do not shift their performance with changing environmental conditions, glancing angle x-ray reflectors, and high energy laser coatings having low absorption, for example.

The present ion beam sputtering process provides an advantage over the conventional magnetron sputtering process in that the operating pressure of the present ion beam sputtering process is an order of magnitude lower than that of the magnetron sputtering process. This results in a greater mean free path, allowing placement of optics at greater distances from targets, and provides for reduced background gas incorporation.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 is a diagram illustrating a sputtering system in which an ion beam sputtering process in accordance with the principles of the present invention may be employed;

FIG. 2 illustrates a process flow diagram of an ion beam sputtering process for fabricating multilayer optical coatings in accordance with the principles of the present invention.

DETAILED DESCRIPTION

Figure 3:
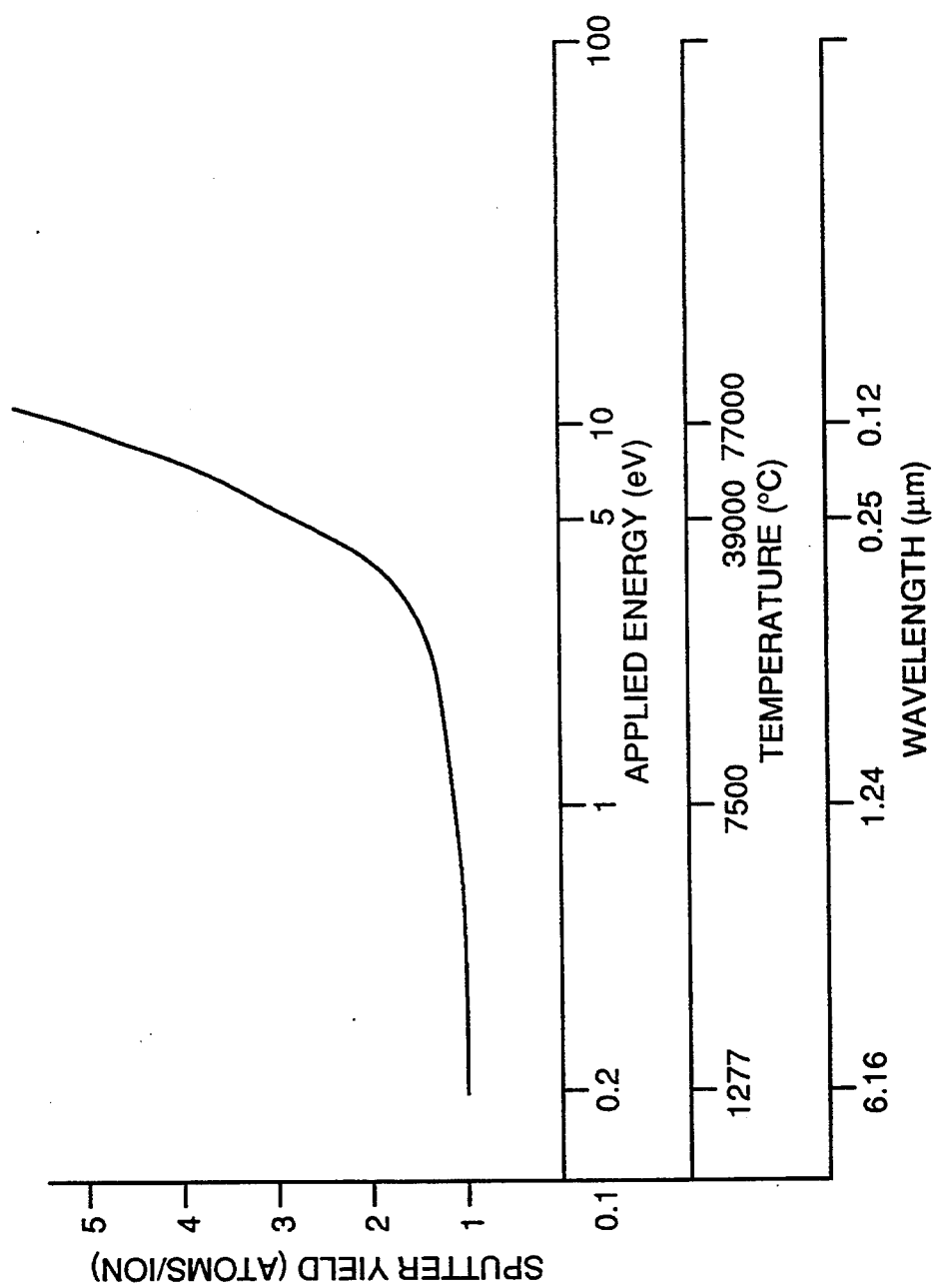
FIG. 3 is a graph of sputter yield (atoms/ion) versus added energy (eV).

Referring to the drawing figures, FIG. 1 is a diagram illustrating a sputtering system 10 in which an ion beam sputtering process 20 in accordance with the principles of the present invention may be employed. FIG. 1 shows a sputtering chamber 11 into which is disposed a sputtering target 12, and an optical element 13 onto which a multilayer optical coating 14 is to be deposited. An energy source 15, such as an acoustic (ultrasonic) energy source, a laser source, or a means of inducing lattice strain in the sputtering target 12. A pressure source 16 is connected to the sputtering chamber 11 in a conventional manner.

Referring to FIG. 2, it illustrates a process flow diagram of an ion beam sputtering process 20 for fabricating the multilayer optical coating 14 in accordance with the principles of the present invention. The ion beam sputtering process 20 comprises the following steps. The first step is to provide the sputtering chamber 11, illustrated in step 21. Then, the sputtering target 12 having a predetermined binding energy is disposed in the sputtering chamber 11, illustrated in step 22. Then, the optical element 13 onto which the multilayer optical coating 14 is to be deposited is disposed into the sputtering chamber 11, illustrated in step 23. The energy source 15 is disposed in the sputtering chamber 11, illustrated in step 24. The sputtering chamber 11 is then pressurized to a predetermined sputtering pressure using the pressure source 16, illustrated in step 25. Energy is then applied to the sputtering target 12 by means of the energy source 15 to increase the vibrational energy of surface atoms and mean target energy of the sputtering target 12, illustrated in step 26. This decreases the amount of energy required to sputter atoms from the surface of the sputtering target 12 onto the surface of the optical element 13 to create the optical coating 14. Energy may be added to the surface atoms of the sputtering target 12 by adding acoustic (ultrasonic) energy, by irradiating the surface of the sputtering target 12 using a laser, or by causing lattice strain in the sputtering target 12. Lattice strain in the sputtering target 12 may be achieved by bending the target over a mandrill to cause stress in the target surface, or grinding the surface of the target to incorporate stresses into the surface, for example.

The approach of the invention for increasing the deposition rate is supported by sputtering theory. This theory states that sputtering rate is proportional to the product of the number of atoms displaced, the number of atomic layers that contain these atoms, the number of atoms per unit area, and the cross sectional area of each atom. The energy of the target atom and the sputtering atom ($E_1$) is included in the atom displacement term by $E_1/E_b$ where $E_b$ is the binding energy of the target atom. Sigmund's expression (see Physics Review, volume 18, p. 383, 1969) for sputtering yield results in:

$$s = \frac{3\alpha}{4\pi^2} \frac{4M_1M_2}{(M_1 + M_2)^2} \frac{E_1}{E_b} \quad [E_1 < 1 \text{ keV}]$$

where $M_1$ and $M_2$ are the masses of target and sputter atoms respectively, and $\alpha$ is an efficiency parameter of momentum transfer that increases monotonically from 0.17 to 1.4 as $M_1/M_2$ ranges from 0.1 to 10. Changing the binding energies affects the sputtering yield.

Increasing the mean energy of the sputtering target 12 decreases the binding energy ($E_b$) and increases the rate. A rough estimate of the effects of increasing target atom energy on sputter yield is shown in the graph of FIG. 3. This calculation is based only on the decrease in the binding energy and does not take into account any statistical events or vapor pressure effects from the added energy, which further increases the rate. Irradiating the sputtering target 12 with ultrasonic energy, for example, increases the vibrational modes and, hence, the mean energy of the atoms of the sputtering target 12. Ultrasonic power can exceed 700 Watts using a small (transducer) area.

More particularly, FIG. 3 is a graph of sputter yield (atoms/ion) versus added energy (eV). This curve is estimated from a modified relationship developed by Sigmund (referenced above). Energy may be added to the surface atoms by acoustic means, by laser irradiation, or by lattice strain. Although the calculation illustrated in FIG. 3 shows the increase in rate with added energy, it does not take into account any statistical events (or any vapor pressure events) from the added energy which further increases the sputtering rate.

The present ion beam sputtering process 20 is adapted to produce superior quality optical coatings 14 that provide for low absorption, high packing density, good step coverage, and may use new coating materials, and is a relatively fast process. In contrast, the deposition rates of the conventional ion beam sputtering process described in the Background section hereof are about 1 Å/second resulting in deposition times of approximately 40 hours for a dielectric reflector coating, for example. The present process 20 increases the mean energy of the target atoms, thus reducing the energy required for target atoms to sputter. The present process 20 increases the sputtering yield to a rate of approximately 5 Å/second which permits fabrication of multilayer coatings 14 within a reasonable length of time, typically on the order of 8 hours, for example.

The present process 20 has been developed to produce superior quality optical films for use in optical applications. These optical applications include laser safety filters that do not shift their performance with changing environmental conditions, glancing angle x-ray reflectors, and high energy laser coatings having low absorption, for example.

The present ion beam sputtering process 20 provides an advantage over the conventional magnetron sputtering process in that the operating pressure of the present process 20 is an order of magnitude lower than that of the magnetron sputtering process. This results in a greater mean free path, allowing placement of optics at greater distances from targets, and provides for reduced background gas incorporation.

Thus there has been described a new and improved ion beam sputtering process for producing multilayer optical coatings, and the like. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An ion beam sputtering process for fabricating a multilayer optical coating, said process comprising the steps of:

providing a sputtering chamber;

disposing a sputtering target having a predetermined binding energy in the sputtering chamber;

disposing an optical element onto which a multilayer optical coating is to be deposited into the sputtering chamber;

disposing an ultrasonic energy source into the sputtering chamber;

pressurizing the sputtering chamber to a predetermined sputtering pressure;

applying ultrasonic energy to the sputtering target to increase the vibrational energy of surface atoms and mean target energy of the sputtering target, thereby decreasing the amount of ion beam energy required to sputter atoms from the surface of the sputtering target onto the surface of the optical element.

2. The method of claim 1 wherein the step of applying ultrasonic energy to the surface of the sputtering target comprises the step of applying on the order of 700 watts of ultrasonic energy to the surface of the sputtering target.

3. The method of claim 1 wherein the step of applying energy to the sputtering target comprises the step of causing lattice strain in the sputtering target.

* * * * *